US 9,754,791 B2

United States Patent
Godet et al.

(10) Patent No.: US 9,754,791 B2
(45) Date of Patent: Sep. 5, 2017

(54) SELECTIVE DEPOSITION UTILIZING MASKS AND DIRECTIONAL PLASMA TREATMENT

(71) Applicant: Applied Materials, Inc., Santa Clara, CA (US)

(72) Inventors: Ludovic Godet, Sunnyvale, CA (US); Yin Fan, Sunnyvale, CA (US); Ellie Y. Yieh, San Jose, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/680,879

(22) Filed: Apr. 7, 2015

(65) Prior Publication Data

US 2016/0233100 A1 Aug. 11, 2016

Related U.S. Application Data

(60) Provisional application No. 62/113,440, filed on Feb. 7, 2015.

(51) Int. Cl.
*H01L 21/44* (2006.01)
*H01L 21/285* (2006.01)
(Continued)

(52) U.S. Cl.
CPC ........ *H01L 21/28562* (2013.01); *C23C 14/04* (2013.01); *C23C 14/48* (2013.01);
(Continued)

(58) Field of Classification Search
CPC ......... H01L 21/28562; H01L 21/02175; H01L 21/02178; H01L 21/02181; H01L 21/0228;
(Continued)

(56) References Cited

U.S. PATENT DOCUMENTS 4,290,843 A * 9/1981 Korenstein ............. C30B 19/02
216/108
5,425,808 A 6/1995 Tokunaga et al.
(Continued)

FOREIGN PATENT DOCUMENTS

JP 2001267266 A 9/2001
KR 100161389 1/1999

OTHER PUBLICATIONS

International Search Report and Written Opinion for International Application No. PCT/US2016/016408 (APPM/022677PCT) dated May 20, 2016.

*Primary Examiner* — Tod T Van Roy
*Assistant Examiner* — Vu A Vu
(74) *Attorney, Agent, or Firm* — Patterson + Sheridan LLP

(57) ABSTRACT

Methods for selectively depositing different materials at different locations on a substrate are provided. A selective deposition process may form different materials on different surfaces, e.g., different portions of the substrate, depending on the material properties of the underlying layer being deposited on. Ion implantation processes may be used to modify materials disposed on the substrate. The ions modify surface properties of the substrate to enable the subsequent selective deposition process. A substrate having a mask disposed thereon may be subjected to an on implantation process to modify the mask and surfaces of the substrate exposed by the mask. The mask may be removed which results in a substrate having regions of implanted and non-implanted materials. A subsequent deposition process may be performed to selectively deposit on either the implanted or non-implanted regions of the substrate.

14 Claims, 8 Drawing Sheets

(51) Int. Cl.

| | |
|---|---|
| *H01L 21/02* | (2006.01) |
| *H01L 21/027* | (2006.01) |
| *H01L 21/033* | (2006.01) |
| *H01L 21/311* | (2006.01) |
| *H01L 21/3115* | (2006.01) |
| *H01L 21/768* | (2006.01) |
| *C23C 14/04* | (2006.01) |
| *C23C 14/48* | (2006.01) |
| *C23C 16/04* | (2006.01) |
| *C23C 16/455* | (2006.01) |
| *H01J 37/32* | (2006.01) |
| *H01L 21/265* | (2006.01) |

(52) U.S. Cl.
CPC ........ *C23C 16/04* (2013.01); *C23C 16/45525* (2013.01); *H01J 37/3244* (2013.01); *H01J 37/32412* (2013.01); *H01J 37/32422* (2013.01); *H01J 37/32449* (2013.01); *H01J 37/32623* (2013.01); *H01L 21/0228* (2013.01); *H01L 21/0274* (2013.01); *H01L 21/02175* (2013.01); *H01L 21/02178* (2013.01); *H01L 21/02181* (2013.01); *H01L 21/02274* (2013.01); *H01L 21/0337* (2013.01); *H01L 21/265* (2013.01); *H01L 21/28568* (2013.01); *H01L 21/31111* (2013.01); *H01L 21/31133* (2013.01); *H01L 21/31155* (2013.01); *H01L 21/76879* (2013.01)

(58) Field of Classification Search
CPC ............ H01L 21/0274; H01L 21/0337; H01L 21/28568; H01L 21/31111; H01L 21/31133; H01L 21/31155; H01L 21/76879
USPC ........................................................ 438/677
See application file for complete search history.

(56) References Cited

U.S. PATENT DOCUMENTS

| | | | | |
|---|---|---|---|---|
| 5,654,245 | A * | 8/1997 | Allen | H01L 21/32051 257/E21.295 |
| 6,380,004 | B2 * | 4/2002 | Boden, Jr. | H01L 21/8238 257/E21.632 |
| 7,183,183 | B2 * | 2/2007 | Duerksen | H01L 21/26586 257/E21.345 |
| 7,208,381 | B2 | 4/2007 | Lee | |
| 7,619,285 | B2 * | 11/2009 | Shin | H01L 21/82381 257/369 |
| 7,767,592 | B2 | 8/2010 | Kim | |
| 7,985,669 | B2 * | 7/2011 | Huotari | H01L 21/28079 257/E21.637 |
| 8,241,512 | B2 | 8/2012 | Lee et al. | |
| 8,383,318 | B2 * | 2/2013 | Meador | G03F 7/091 430/270.1 |
| 8,507,185 | B2 * | 8/2013 | Bae | G03F 7/0035 430/270.1 |
| 8,610,233 | B2 * | 12/2013 | Cheng | H01L 21/84 257/454 |
| 2002/0151156 | A1 | 10/2002 | Hallock et al. | |
| 2010/0289109 | A1 | 11/2010 | Henning et al. | |
| 2012/0231611 | A1 * | 9/2012 | Gatineau | C07D 211/12 438/478 |
| 2012/0264307 | A1 * | 10/2012 | Kundalgurki | H01L 21/02057 438/705 |
| 2013/0087527 | A1 * | 4/2013 | Pain | B82Y 10/00 216/18 |
| 2015/0014777 | A1 * | 1/2015 | Yan | H01L 27/088 257/368 |

* cited by examiner

SELECTIVE DEPOSITION UTILIZING MASKS AND DIRECTIONAL PLASMA TREATMENT

CROSS-REFERENCE TO RELATED APPLICATIONS

This application claims benefit of U.S. Provisional Patent Application No. 62/113,440, filed Feb. 7, 2015, the entirety of which is herein incorporated by reference.

BACKGROUND

Field

Embodiments described herein generally relate to methods for depositing materials on a semiconductor substrate. More specifically, embodiments described herein relate to methods for selective depositing utilizing masks and precision materials engineering techniques.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density.

As circuit densities increase for next generation devices, the widths of interconnects, such as vias, trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other.

FIG. 1 (prior art) depicts a fin field effect transistor (FinFET) 150 disposed on a substrate 100. The substrate 100 includes a plurality of semiconductor fins 102 formed thereon isolated by shallow trench isolation (STI) structures 104. The shallow trench isolation (STI) structures 104 may be formed by an insulating material.

The substrate 100 may include a portion in an NMOS device region 101 and a portion in a PMOS device region 103 as needed, and each of the semiconductor fins 102 may be sequentially and alternatively formed in the NMOS device region 101 and the PMOS device region 103 in the substrate 100. The semiconductor fins 102 are formed protruding above the top surfaces of the shallow trench isolation (STI) structures 104. Subsequently, a gate structure 106, typically including a gate electrode layer disposed on a gate dielectric layer, is deposited on both of the NMOS device region 101 and the PMOS device region 103 and over the semiconductor fins 102.

The gate structure 106 may be patterned to expose portions 148, 168 of the semiconductor fins 102 uncovered by the gate structure 106. The exposed portions 148, 168 of the semiconductor fins 102 may then be doped with dopants to form lightly doped source and drain (LDD) regions using an implantation process. The patterning process generally utilizes lithographic techniques to form a two dimensional pattern from which 3D structures are created. Often, different surface properties in the two dimensional pattern can increase the complexity of subsequent deposition processes.

Selective deposition processes have been developed to selectively deposit materials on substrates. A conventional method for selective deposition may be performed to locally form a material layer on only certain locations of a planer surface on a substrate made from a material different than the substrate material. FIGS. 2A-2C (prior art) depict an exemplary process utilized to perform the deposition process. The process utilizes self assembled monolayers (SAMs) as a surface modification layer to selectively modify surface properties of the different surface materials exposed on the substrate. For example, a substrate 202 may include a feature 204 formed from a first material (e.g., a silicon oxide layer) disposed on the substrate 202 formed from a second material (e.g., silicon), as shown in FIG. 2A. The feature 204 has an opening 208 defined therein exposing a surface 206 of the substrate 202. SAMs 210 may then be formed on the substrate 202 by a solution based precursor, as shown in FIG. 2B. Generally, the self assembled monolayer (SAM) 210 is formed on the surface that has chemical reaction capability with the molecules from the SAM 210. In the embodiment depicted in FIG. 2B, the precursor utilized to form the SAM 210 is selected to chemically react with a surface 212 of the feature 204, (e.g., a silicon oxide material), rather than the surface 206 of the substrate 202 (e.g., a silicon material). By doing so, the SAM 210 may be predominantly formed on the feature 204 on the substrate 202, leaving the surface 206 of the substrate 202 free of SAM 210. Subsequently, an atomic layer deposition (ALD) process, which is a process highly sensitive to surface conditions, is then performed to form a structure 214 selectively on the designated surface 206 of the substrate 202, as shown in FIG. 2C.

By utilizing the SAM 210 disposed on the features 204, the structure 214 may be formed selectively on only designated surface 206 of the substrate 202. However, in cases when a substrate only contains one type of material, the SAM 210 may be globally formed on the entire surface of such substrate, thereby making the selective material deposition difficult to achieve. In other words, in the case wherein a structure on a substrate is formed by a single type of material, selective deposition via utilization of the SAM may not he successfully enabled, as the self assembled monolayer SAM is to be globally applied without selectivity. For example, the fin structure 102 as depicted in FIG. 1 may be formed by one type of material. However, when only one type of material is desired to be selectively formed or a specific amount of material is desired, utilization of the SAM may not be successful as the SAM may by globally formed on the whole outer surface 120 of the fin structure 102 without selectivity.

Thus, there is a need for improved methods of selective deposition processes.

SUMMARY

In one embodiment, a selective deposition method is provided. The method includes depositing a mask material on a substrate and patterning the mask material to form a patterned mask. Regions of the substrate may be exposed after the patterning and ions may be implanted into the patterned mask and the exposed regions of the substrate. The exposed regions are implanted regions and a material may be deposited on the substrate. The material may be selectively deposited on a desired region of the substrate in response to surface modification of the exposed regions.

In another embodiment, a selective deposition method of provided. The method includes depositing a mask material on a substrate and patterning the mask material to form a patterned mask. Regions of the substrate may be exposed though the patterned mask after the patterning of the mask. Ions may he implanted into the patterned mask and the exposed region of the substrate. The patterned mask may be removed from the substrate to expose non-implanted regions of the substrate and a material may be selectively deposited on either an implanted region or the non-implanted region of the substrate.

In yet another embodiment, a selective deposition method is provided. The method includes implanting fluorine ions into a patterned mask and a first region of a substrate exposed through the patterned mask. The fluorine ions may be implanted at ion dosage less than about $5E^{16}$ (ions/cm$^2$). The patterned mask may be removed from the substrate to expose a second region of the substrate. The second region may be shielded from implantation of fluorine ions during implanting of the fluorine ions in the first region. A material may be deposited using an ALD process while maintaining the substrate at a temperature of less than about 500° Celsius. The ALD process may selectively deposit the material on one of the first or second regions.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to he considered limiting of its scope, for the disclosure may admit to other equally effective embodiments.

Figure 1:
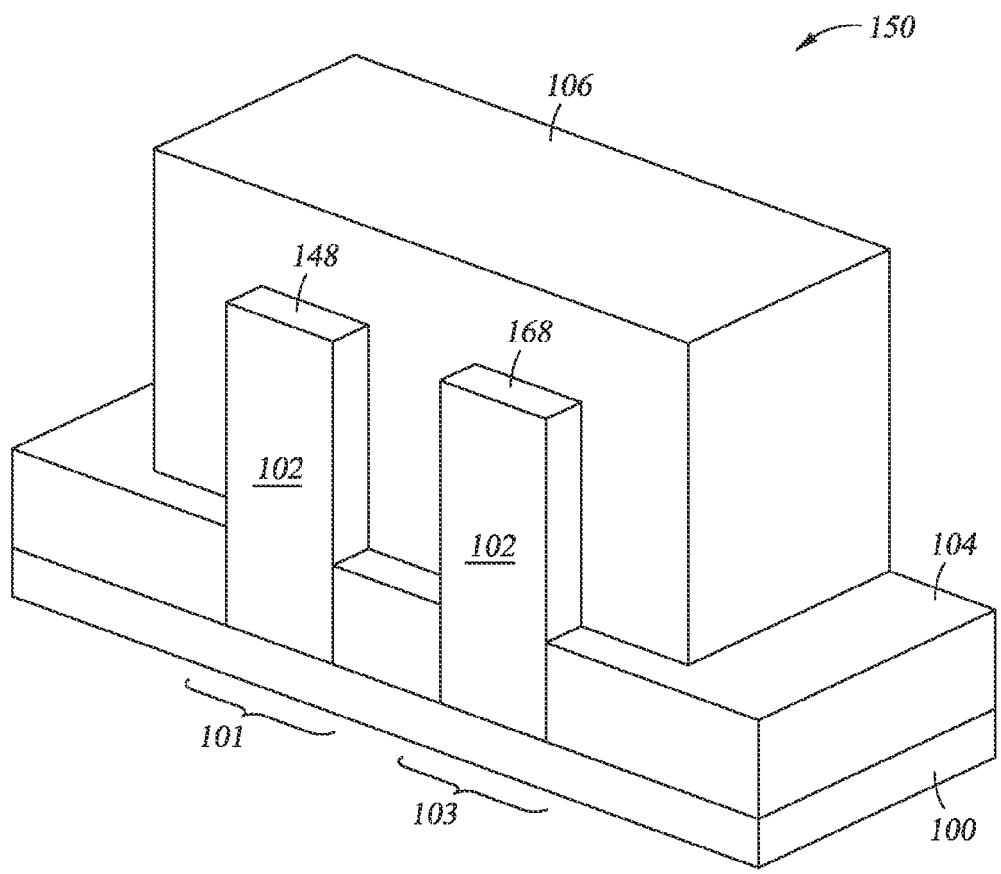
FIG. 1 (prior art) depicts an example schematic perspective view of a substrate having a fin field effect transistor (FinFET) structure formed thereon.
Figure 2A:
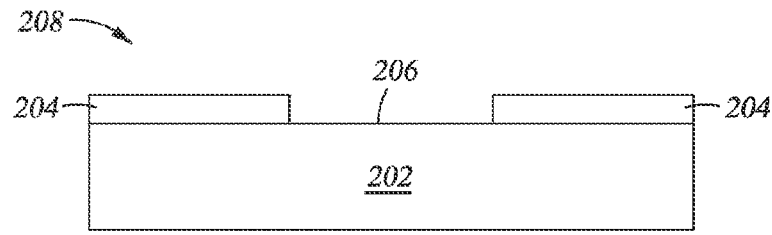
FIGS. 2A-2C (prior art) depict an example process flow for utilizing self assembled monolayers (SAMs) to perform a selective deposition process.
Figure 2B:
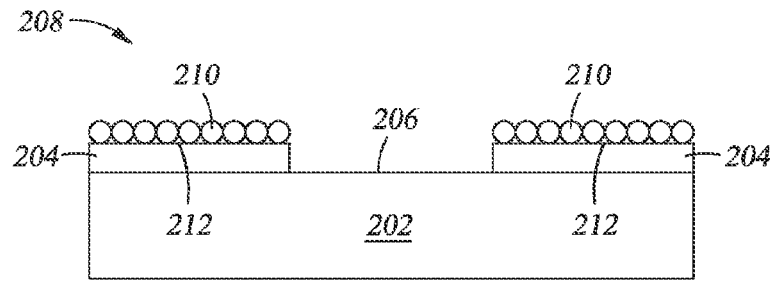
Figure 2C:
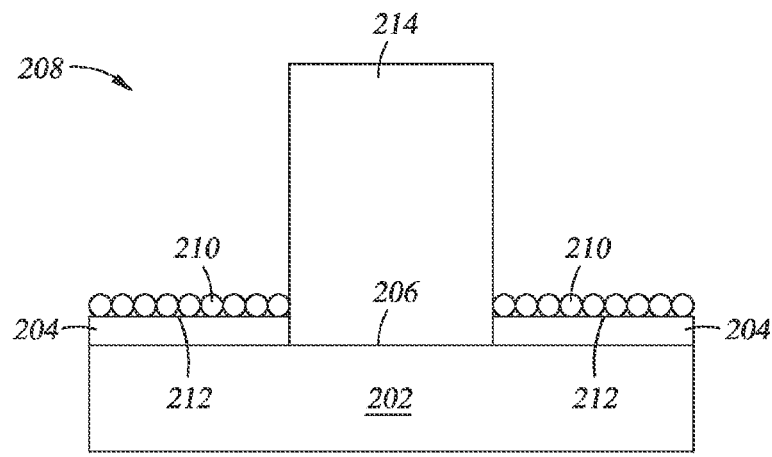

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for selectively depositing different materials at different locations on a substrate are provided. The substrate may include fin structures, gate structures, contact structures, or any suitable structure in semiconductor devices. In one embodiment, a selective deposition process may form different materials on different surfaces, e.g., different portions of the substrate, depending on the material properties of the underlying layer being deposited on. For example, the described methods may use on assisted directional plasma treatment processes or other suitable on implantation processes to modify materials disposed on the substrate. The ions modify surface properties of the substrate to enable the subsequent selective deposition process. That is, a selective deposition process that deposits a material preferentially on one of the modified surface or the non-modified surface relative to the other. In one embodiment, a substrate having a mask disposed thereon may be subjected to an ion implantation process to modify the mask and surfaces of the substrate exposed by the mask. The mask may be removed which results in a substrate having regions of implanted and non-implanted materials. A subsequent deposition process may be performed to selectively deposit on either the implanted or non-implanted regions of the substrate.

Figure 3A:
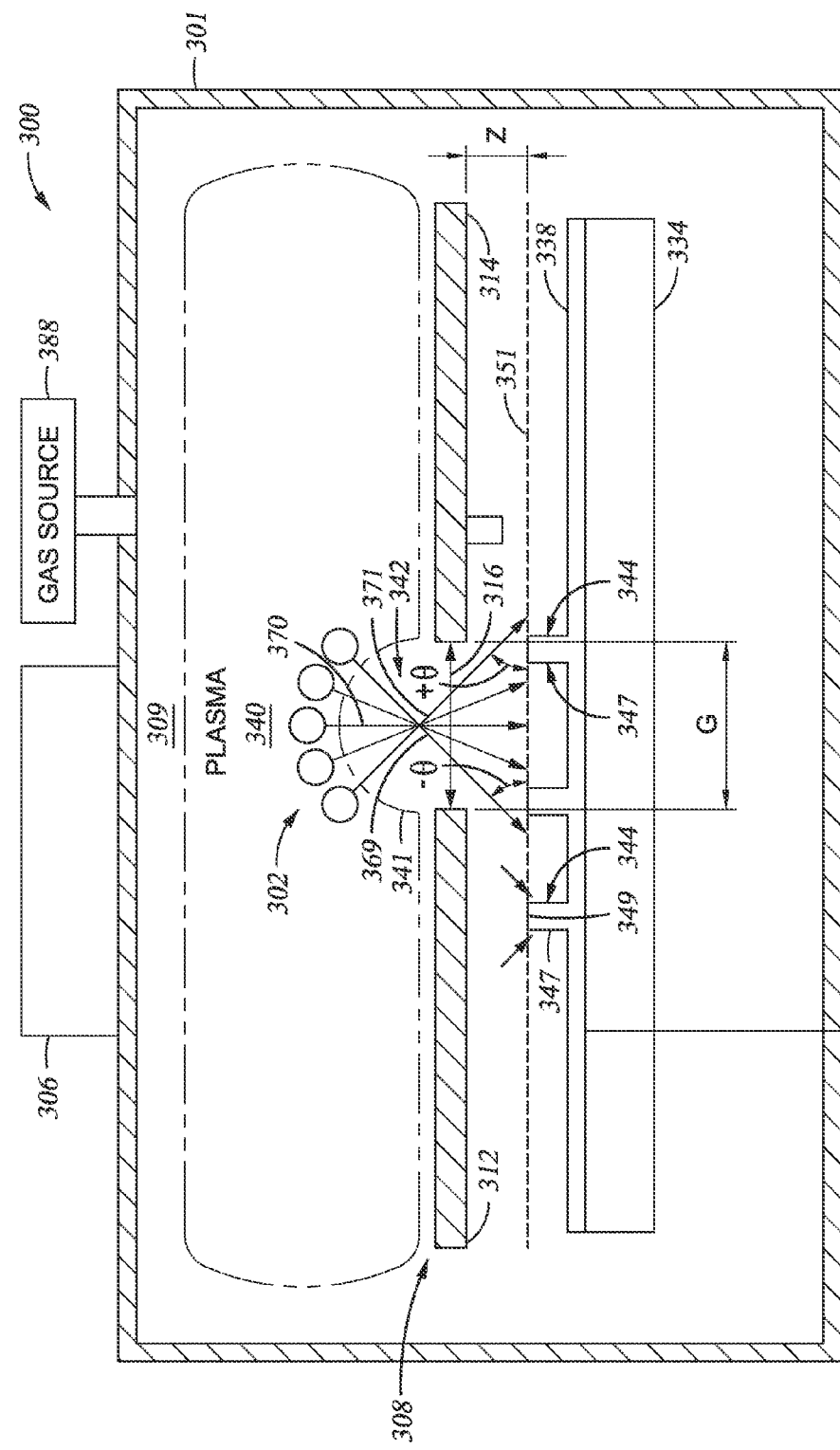
FIG. 3A schematically illustrates an apparatus which may be utilized to implant dopants into a substrate.

FIG. 3A schematically illustrates one embodiment of a processing chamber 300 suitable for implanting dopants into a substrate. In addition to the processing chamber 300 described below, ion implantation apparatuses, such as plasma immersion on implantation apparatus, may be used to perform the methods described herein. The processing chamber 300 as described herein may be utilized as a plasma doping apparatus. However, the processing chamber 300 may also include, but not be limited to, etching and deposition systems. Furthermore, the plasma doping apparatus can perform many differing material modification processes on a substrate. One such process includes doping a substrate, such as a semiconductor substrate, with desired dopant materials.

The processing chamber 300 may include chamber body 301 defining an interior processing region 309. A substrate support 334 is disposed in the processing chamber 300. A substrate 338 having features 344 formed thereon may be disposed on the substrate support 334 during a directional plasma process. The substrate 338 may include, but not be limited to, a semiconductor wafer, flat panel, solar panel, or polymer substrate. The substrate may include or be made from various material, including silicon materials, silicon nitride materials, silicon oxide materials, metal materials, metal oxide materials, and the like. The semiconductor substrate may have a disk shape with a diameter of 200 millimeters (mm), 300 millimeters (mm) or 450 millimeters (mm) or other size, as needed.

An RF plasma source 306 is coupled to the chamber body 301 and configured to generate a plasma 340 in the processing chamber 300. In the embodiment of FIG. 3A, a plasma sheath modifier 308 is disposed in the interior processing region 309. The plasma sheath modifier 308 includes a pair of modifiers 312, 314 defining a gap 316 therebetween. The gap 316 defines a horizontal spacing (G). In some embodiments, the plasma sheath modifier 308 may include an insulator, conductor, or semiconductor. The pair of modifiers 312, 314 may be a pair of sheets having a thin, flat shape. In other embodiments, the pair of modifiers 312, 314 may be other shapes such as tube shaped, wedge shaped, and/or have a beveled edge proximate the gap 316. In one embodiment, the modifiers 312, 314 may be fabricated of quartz, alumina, boron nitride, glass, polysilicon, silicon nitride, silicon carbide, graphite and the like.

The horizontal spacing of the gap 316 defined by the pair of modifiers 312, 314 may be about 6.0 millimeters (mm). The pair of modifiers 312, 314 may also be positioned to define a vertical spacing (Z) above a plane 351. The plane 351 is defined by a front surface of the substrate 338 or a surface of the substrate support 334. In one embodiment, the vertical spacing (Z) may be about 3.0 mm.

A gas source 388 is coupled to the processing chamber 300 to supply an ionizable process gas to the interior processing region 309. Examples of an ionizable process gas include, but are not limited to, $BF_3$, $Bl_3N_2$, Ar, $PH_3$, $AsH_3$, $B_2H_6$, $H_2$, Xe, Kr, Ne, He, $SiH_4$, $SiF_4$, $SF_6$, $C_2F_6$, $CHF_3$, $GeH_4$, $GeF_4$, $CH_4$, $CF_4$, $AsF_5$, $PF_3$ and $PF_5$. The plasma source 306 may generate the plasma 340 by exciting and ionizing the process gas provided to the processing chamber 300. Ions in the plasma 340 may be attracted across the plasma sheath 342 by different mechanisms. In the embodiment of FIG. 3A, a bias source 390 is coupled to the substrate support 334 configured to bias the substrate 338 to attract ions 302 from the plasma 340 across the plasma sheath 342. The bias source 390 may be a DC power supply to provide a DC voltage bias signal or an RF power supply to provide an RF bias signal. In one embodiment, the bias signal may be between about 1 MHz and about 5 MHz, for example, about 2 MHz.

It is believed that the plasma sheath modifier 308 modifies the electric field within the plasma sheath 342 to control a shape of the boundary 341 between the plasma 340 and the plasma sheath 342. The boundary 341 between the plasma 340 and the plasma sheath 342 may have a convex shape relative to the plane 351. When the bias source 390 biases the substrate 338, ions 302 are attracted across the plasma sheath 342 through the gap 316 defined between the modifiers 312, 314 through a large range of incident angles. For instance, ions 302 following trajectory path 371 may strike the substrate 338 at an angle of positive θ (+θ) relative to the plane 351. Ions following trajectory path 370 may strike perpendicularly on the substrate 338 at about an angle of about 90 degrees relative to the same plane 351. Ions following trajectory path 369 may strike the substrate 338 at an angle of negative θ (−θ) relative to the plane 351. Accordingly, the range of incident angles may be between about positive θ (+θ) and about negative θ (−θ), centered about 90 degrees. In addition, some ion trajectories paths such as paths 369 and 371 may cross each other. As such, the processing chamber 300 may be configured to perform directional implantation processes in addition to more traditional ion implantation processes.

Depending on a number of factors including, but not limited to, the horizontal spacing (G) between the modifiers 312 and 314, the vertical spacing (Z) of the plasma sheath modifier 308 above the plane 351, the dielectric constant of the modifiers 312 and 314, and other plasma process parameters, the range of incident angles (θ) may be between +60 degrees and −60 degrees, centered about 0 degrees. Thus, surfaces of the substrate 338, such as three dimensional structures on the substrate 338, may be treated uniformly by the ions 302. In addition, if a mask is formed on the substrate 338, the ions 302 may also treat the mask. It is contemplated that the mask may be a two dimensional mask or a three dimensional mask, depending upon desired patterning techniques. In one example, sidewalls 347 of a feature 344, which may be utilized to form a fin structure for FinFET devices, having an exaggerated size for clarity of illustration, may be more uniformly treated by the ions 302, rather than just a top surface 349. Similarly, a three dimensional mask may also be more uniformly treated.

Figure 3B:
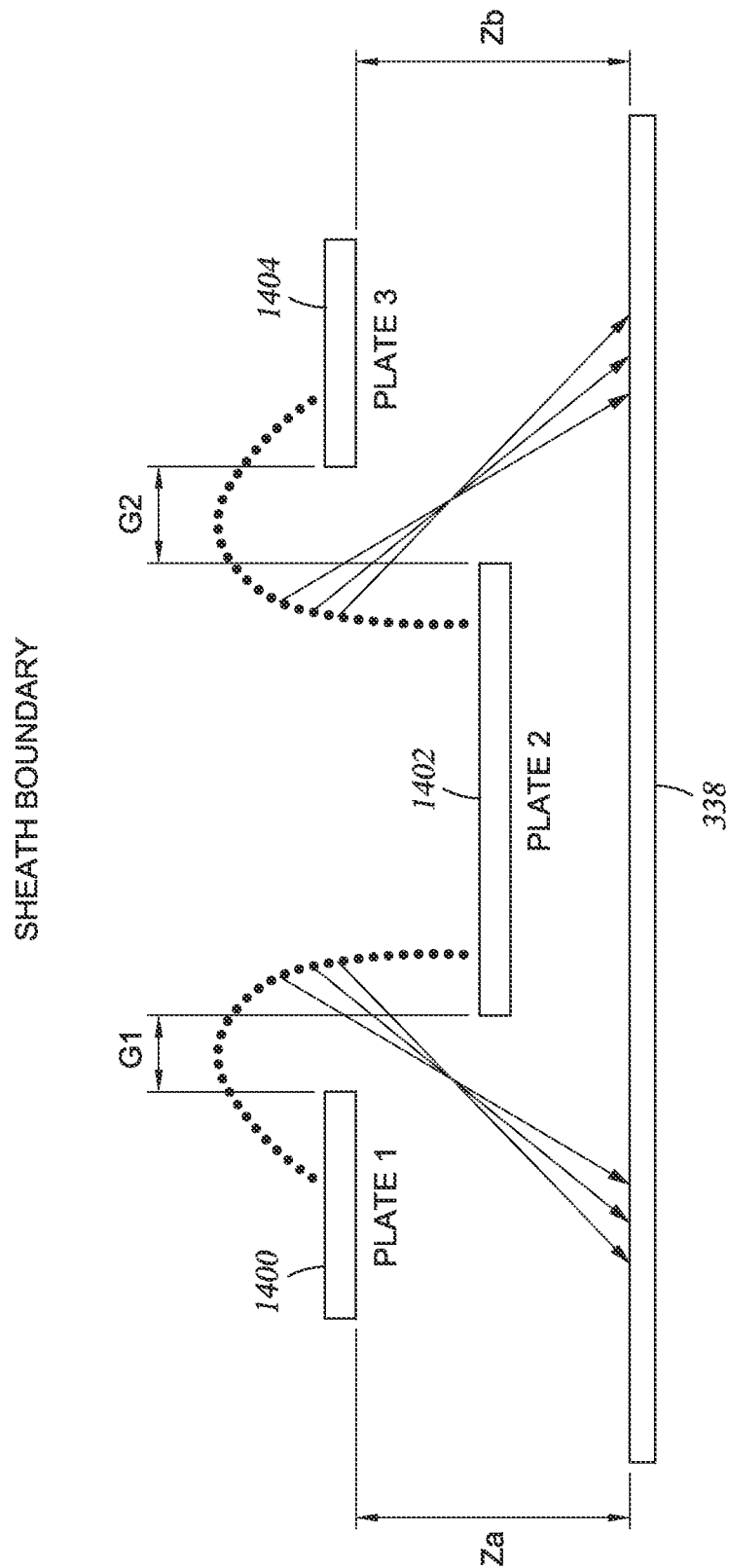
FIG. 3B schematically illustrates another embodiment of an apparatus which may be utilized to implant dopants into a substrate.

Referring to FIG. 3B, instead of a pair of modifiers 312, 314 depicted in FIG. 3A, at least three modifiers 1400, 1402, 1404 are used to control the ions with desired angular distribution to the substrate 338. By arranging the outer two modifiers 1400, 1404 on a common plane equally spaced a distance Za above the substrate 338, the same vertical plane (Za), and by maintaining equal horizontal spacing G1, G2 between the modifiers 1400, 1402, 1404, a symmetric bimodal angular spread of ions, centered about +/−θ (+θ and −θ) degrees, may be obtained.

Figure 4:
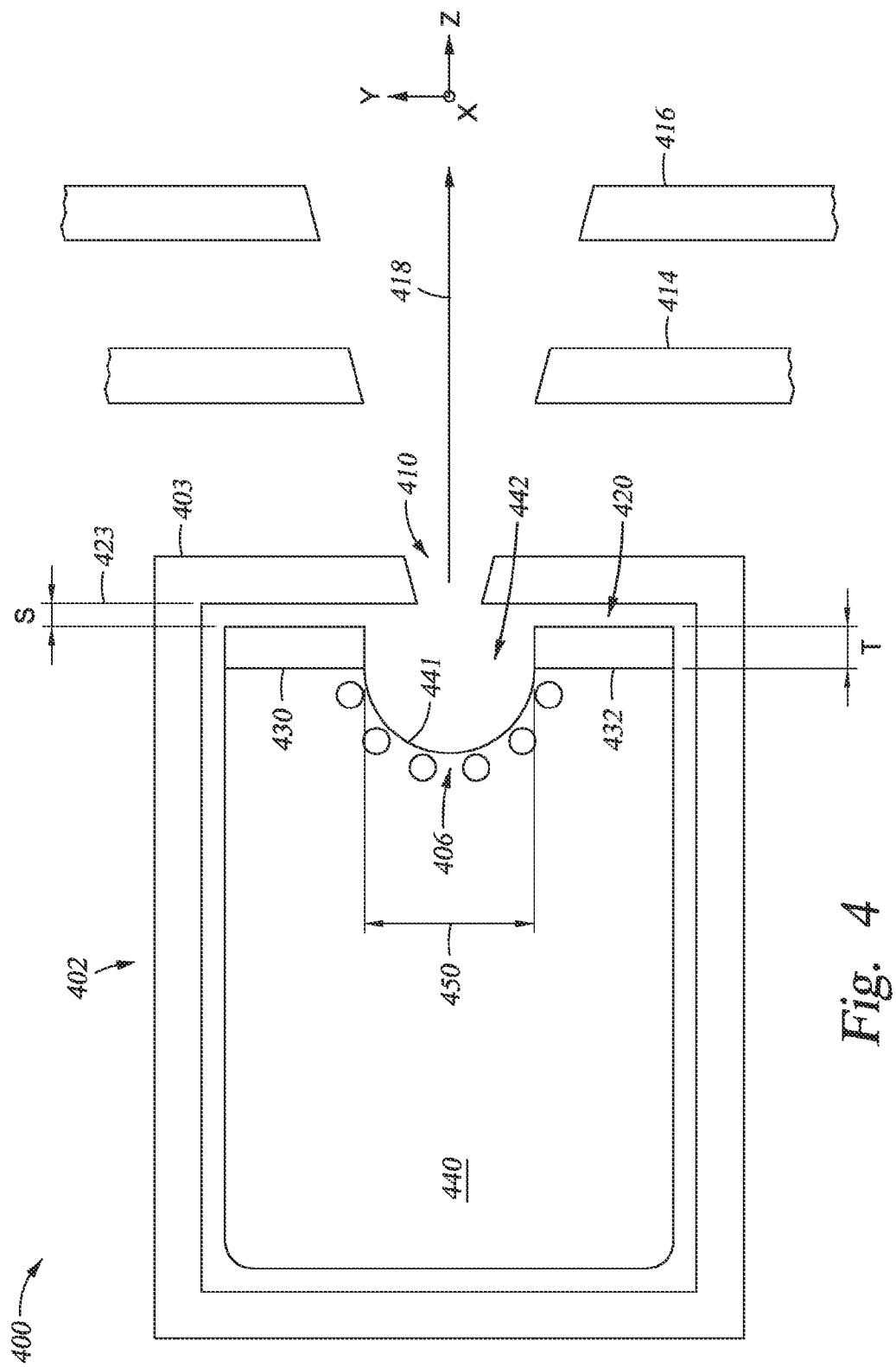
FIG. 4 schematically illustrates another embodiment of an apparatus which may be utilized to implant dopants into a substrate.

As described above, the incident angles of ions implanted into the substrate 338 may be modified by varying the vertical spacing between the outer modifiers 1400, 1404 and the middle modifier 1402, so as to vary the gap angles. The angular ion spread can be modified by varying the horizontal spacing (G1, G2) between the modifiers 1400, 1402, 1404, so as to vary the gap width defined by the horizontal spacing (G1, G2). An asymmetric distribution can be created by making Za different than Zb, by choosing G1 different than G2, or a combination of both actions. In one embodiment, the angular ion spread can be modified from between about 0 degrees and about 30 degrees from the center to only treat or implant ions into one side of a structure. Similarly, an asymmetric distribution may be utilized to dope a mask such that a portion less than the entire mask is implanted. In another embodiment, one or more of the modifiers 1400, 1402, 1404, such as the middle modifier 1402, may have an aperture formed therein through which ions may pass. It is contemplated that the various modifier configurations may provide a desired angular ion distribution to allow for FIG. 4 depicts another embodiment of an ion processing chamber 400 that may be utilized to implant ions into a substrate with desired and variable incident angles. The processing chamber 400 includes an ion source 402 having a sidewall 403 with an extraction aperture 410. The processing chamber 400 further includes a plasma sheath modulator 420 to control a shape of a boundary 441 between the plasma 440 and the plasma sheath 442 proximate the extraction aperture 410. An extraction electrode assembly extracts ions 406 from the plasma 440 and accelerates the ions across the plasma sheath 442 to form a well-defined ion beam 418. The extraction electrode assembly may include the sidewall 403 functioning as an arc slot electrode, a suppression electrode 414 and a ground electrode 416. The suppression electrode 414 and the ground electrode 416 each have an aperture aligned with the extraction aperture 410 for extraction of the well-defined ion beam 418. To aid with explanation, a Cartesian coordinate system is defined where the ion beam 418 travels in the Z direction. The X-Y plane is perpendicular to the Z direction which can change depending on the direction of the ion beam 418.

In the embodiment of FIG. 4, the plasma sheath modulator 420 includes a pair of modifiers 430, 432 positioned in the ion source 402. In other embodiments, the modulator 420 may include one modifier. The modifiers 430, 432 may be fabricated of quartz, alumina, boron nitride, silicon, silicon carbide, graphite, glass, porcelain, silicon nitride and the like. The pair of modifiers 430, 432 may be a pair of sheets having a thin, flat shape. In other embodiments, the pair of modifiers 430, 432 may be other shapes such as tube shaped, wedge shaped, and/or have a beveled edge. The pair of modifiers 430, 432 defines a gap 450 there between having spacing (G). The pair of modifiers 430, 432 may also be positioned a vertical spacing (S) above the plane 423 defined by an interior surface of the sidewall 403 having the extraction aperture 410.

In operation, a process gas (not illustrated) is supplied to the on source 402. Examples of the process gas include, but are not limited to, $BF_3$, $Bl_3N_2$, Ar, $PH_3$, $AsH_3$, $B_2H_6$, $H_2$, Xe, $SF_6$, $C_2F_6$, $CHF_3$, Kr, Ne, He, $SiH_4$, $SiF_4$, $GeH_4$, $CF_4$, $AsF_5$, $PF_3$ and $PF_5$. The process gas may originate from a gas source or may be vaporized from a solid source depending on the desired species. The process gas is ionized in the ion source 402 to generate a plasma. Other types of ion sources that generate plasma include an indirectly heated cathode (IHC) source, a Bernas source, a RF source, a microwave source, a helicon source, and an electron cyclotron resonance (ECR) source. An IHC source generally includes a filament positioned in close proximity to a cathode, and also includes associated power supplies. The cathode (not illustrated) is positioned in the ion source 402. As the filament is heated, electrons emitted by the filament are accelerated towards the cathode to provide for heating of the cathode. The heated cathode, in turn, provides electrons into the arc chamber that have ionizing collisions with the gas molecules of the process gas to generate plasma.

An extraction electrode assembly including the sidewall 403, the suppression electrode 414, and the ground electrode 416, extracts ions 406 from the plasma 440 in the ion source 402 into the well-defined ion beam 418. The ions 406 are accelerated across the boundary 441 and the plasma sheath 442 through the gap 450 between the pair of modifiers 430, 432. The ion source 402 may be biased with DC, pulsed DC, RF current, and/or pulsed RF current while the substrate is maintained at ground potential. Alternatively, the ion source 402 may be at ground potential and the substrate may be biased with DC or pulsed DC. The suppression electrode 414 may be biased at a moderately negative value to prevent electrons from entering back into the ion source 402. The ground electrode 416 may be at ground potential. The strength of the electric field generated by the electrode assembly may be tuned to achieve a desired beam current and energy.

Advantageously, the plasma sheath modulator 420 controls a shape of the boundary 441 between the plasma 440 and the plasma sheath 442 proximate the extraction aperture 410. To control the shape of the boundary 441 the plasma sheath modulator 420 modifies or influences the electric field within the plasma sheath 442. When the plasma sheath modulator 420 includes the pair of modifiers 430, 432, the boundary 441 may have a concave shape relative to the plasma 440 as illustrated in FIG. 4. Depending on a number of factors including, but not limited to, the horizontal spacing (G) between the modifiers 430, 432, the vertical spacing (S) of the modifiers 430, 432 above the plane of the substrate or substrate support, the material and thickness thereof of the modifiers 430, 432, and other process parameters of the ion source, the shape of the boundary 441 may be controlled.

The shape of the boundary 441 between the plasma 440 and the plasma sheath 442, together with the electric field gradients within the plasma sheath 442, control parameters of the ion beam. For example, the angular spread of the ions 406 can be controlled to assist with on beam focusing. For instance, with the boundary 441 having a concave shape relative to the plasma, there is a large angular spread of ions accelerated across the boundary to assist with beam focusing. In addition, the on beam current density of the on beam 418 can also be controlled. For example, compared to the boundary 441 of one conventional ion source, the boundary 441 has a larger area to extract additional ions. Thus, the additional extracted ions contribute to an increased ion beam current density. Accordingly, with all other parameters being equal, the shape of the boundary 441 can provide a focused ion beam with a high ion beam current density. Furthermore, the emittance of the ion beam can also be controlled by controlling the shape of the boundary 441. Consequently, the beam quality of the extracted ion beam can be well defined for a given particle density and angular distribution.

Figure 5:
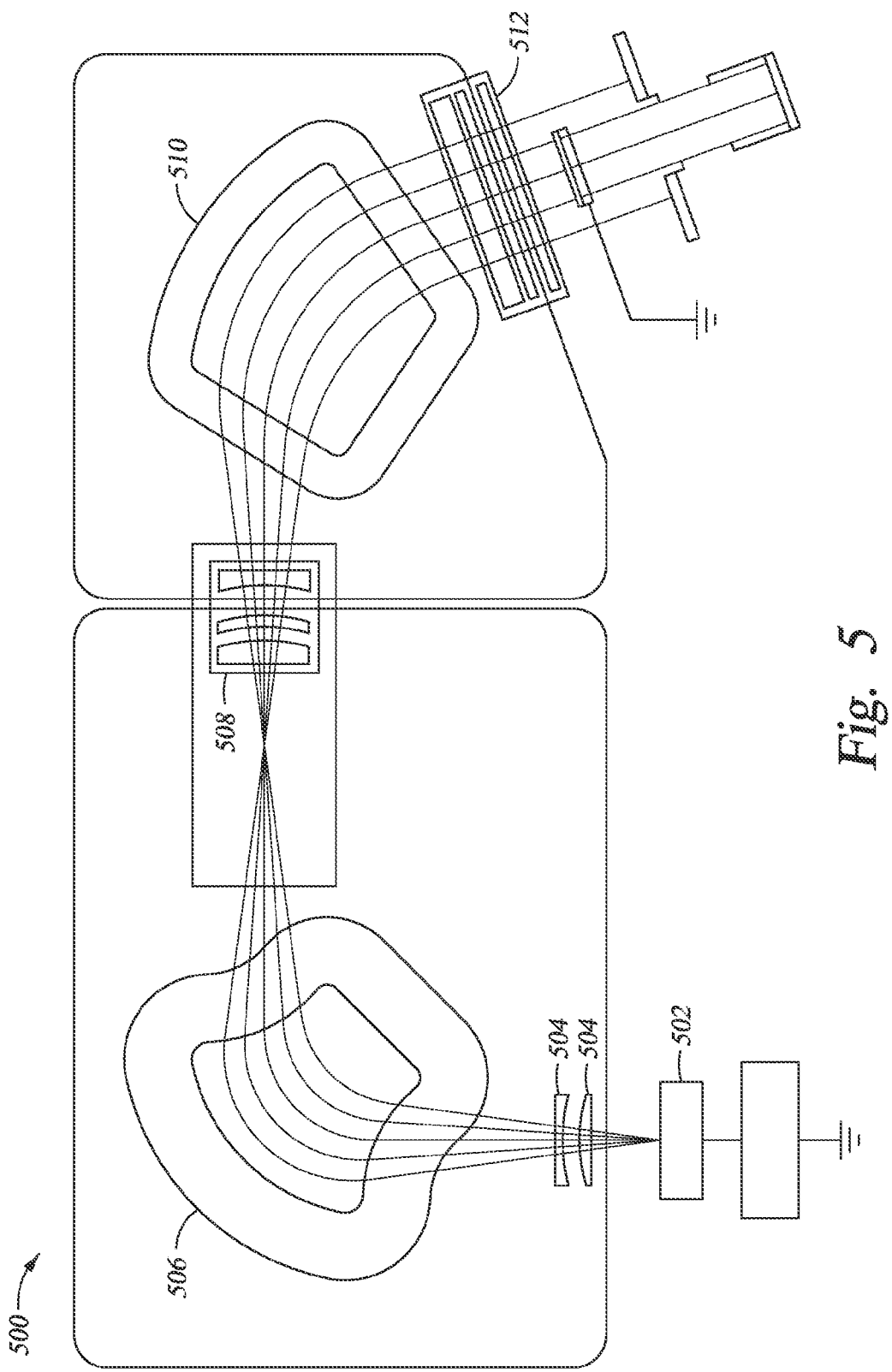
FIG. 5 illustrates a schematic plan view of another embodiment of an apparatus which may he utilized to implant dopants into a substrate.

FIG. 5 depicts an ion implant processing chamber 500, such as a beamline implantation apparatus, that may be utilized to implant ions into certain regions of the substrate. One example of a beamline apparatus which may be used to perform the embodiments described herein is the VARIAN VIISTA® TRIDENT system available from Applied Materials, Inc. of Santa Clara, Calif. It is contemplated that other suitably configured systems from other manufacturers may also benefit from the embodiments disclosed herein. Other apparatus, such as plasma immersion ion implantation (P3i) and plasma doping (PLAD) apparatus may also be utilized to perform the embodiments described herein.

The on implanting processing chamber 500 includes an ion source 502, extraction electrodes 504, a 90 degree magnet analyzer 506, a first deceleration (D1) stage 508, a magnet analyzer 510, and a second deceleration (D2) stage 512. The deceleration stages D1, D2 (also known as "deceleration lenses") are each comprised of multiple electrodes with a defined aperture to allow an ion beam to pass therethrough. By applying different combinations of voltage potentials to the multiple electrodes, the deceleration lenses D1, D2 can manipulate on energies and cause the ion beam to hit a target wafer at a desired energy which implants ions into a substrate. The above-mentioned deceleration lenses D1, D2 are typically electrostatic triode (or tetrode) deceleration lenses.

It is contemplated that any of the above apparatus 300, 400, 500 may be utilized to implant ions into a substrate and/or a mask disposed on a substrate. Ions may be implanted at desired incident angles utilizing suitable configured apparatus or ions may be implanted along a direction normal to a surface of the substrate and/or mask. Such implantation processes may be selected to implant desired dopant species with desired dosages.

Figure 6:
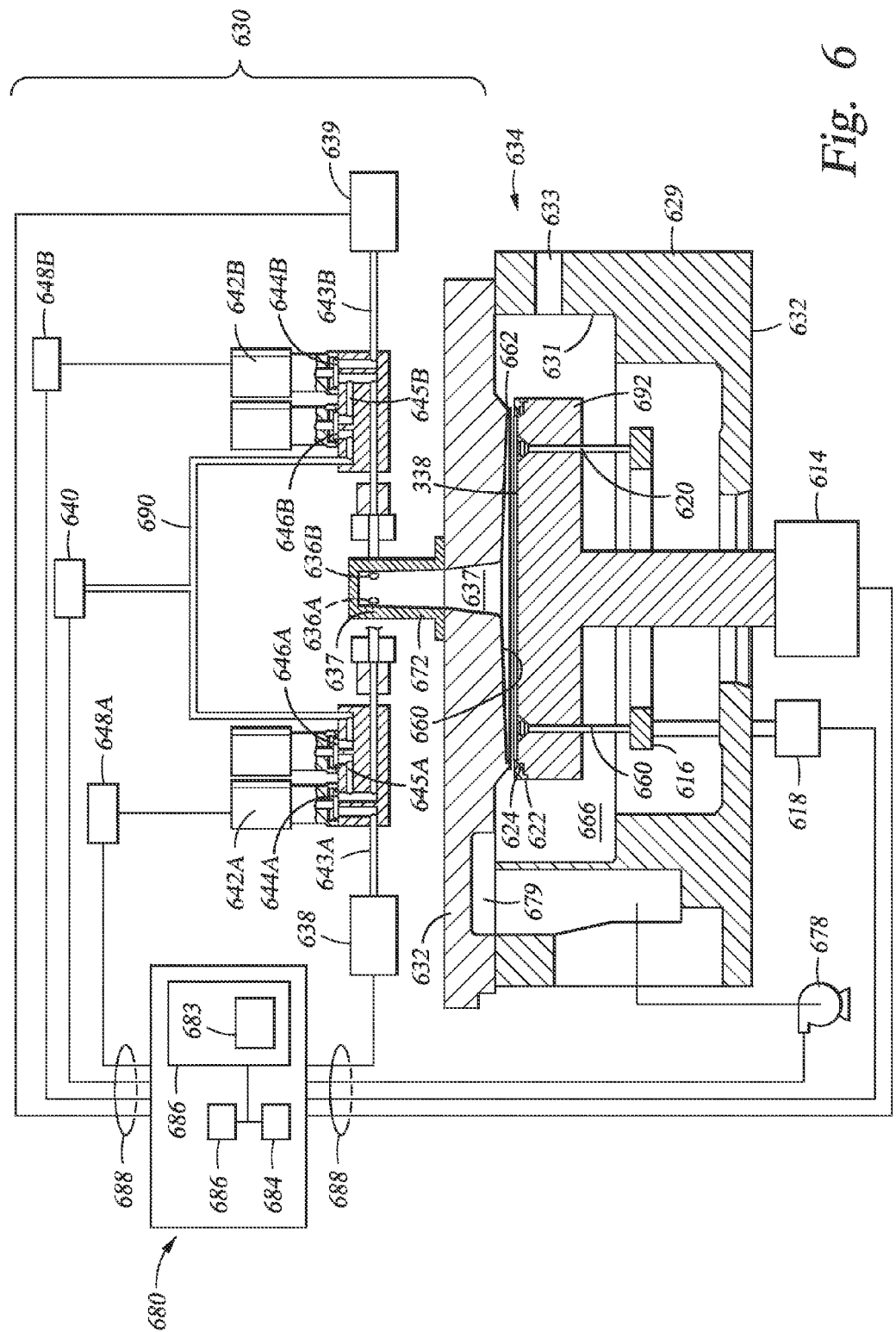
FIG. 6 schematically illustrates a cross-sectional view of an apparatus that may be utilized to perform an atomic layer deposition (ALD) process.

FIG. 6 is a schematic cross-sectional view of one embodiment of an atomic layer deposition (ALD) processing chamber 634. The ALD processing chamber 634 includes a gas delivery apparatus 630 adapted for cyclic deposition, such as ALD or chemical vapor deposition (CVD). The terms ALD and CVD as used herein refer to the sequential or concurrent introduction of reactants to deposit a thin layer over a substrate structure. The sequential introduction of reactants may be repeated to deposit a plurality of thin layers to form a conformal layer to a desired thickness. The chamber 634 may also be adapted for other deposition techniques along with lithography process, such as 193 nm immersion lithography processes. It is contemplated that separate apparatus may also be utilized for lithography processes.

The chamber 634 comprises a chamber body 629 having sidewalls 631 and a bottom 632. A slit valve tunnel 633 formed through the chamber body 629 provides access for a robot (not shown) to deliver and retrieve a substrate 338, such as a 200 mm, 300 mm or 450 mm semiconductor substrate or a glass substrate, from the chamber 634.

A substrate support 692 is disposed in the chamber 634 and supports the substrate 338 during processing. The substrate support 692 is mounted to a lift 614 to raise and lower the substrate support 692 and the substrate 338 disposed thereon. A lift plate 616 is connected to a lift plate actuator 618 that controls the elevation of the lift plate 616. The lift plate 616 may be raised and lowered to raise and lower pins 620 movably disposed through the substrate support 692. The pins 620 are utilized to raise and lower the substrate 338 over the surface of the substrate support 692. The substrate support 692 may include a vacuum chuck, an electrostatic chuck, or a clamp ring for securing the substrate 338 to the surface of the substrate support 692 during processing.

The substrate support 692 may be heated to heat the substrate 338 disposed thereon. For example, the substrate support 692 may be heated using an embedded heating element, such as a resistive heater, or may be heated using radiant heat, such as heating lamps disposed above the substrate support 692. In certain embodiments, the substrate 338 may be heated to a temperature of less than about 500° Celsius during the deposition process, such as between about 125° Celsius and about 450° Celsius. A purge ring 622 may be disposed on the substrate support 692 to define a purge channel 624 which provides a purge gas to a peripheral portion of the substrate 338 to prevent deposition thereon.

A gas delivery apparatus 630 is disposed at an upper portion of the chamber body 629 to provide a gas, such as a process gas and/or a purge gas, to the chamber 634. A pumping system 678 is in communication with a pumping channel 679 to evacuate any desired gases from the chamber 634 and to help maintain a desired pressure or a desired pressure range inside a pumping zone 666 of the chamber 634.

In one embodiment, the gas delivery apparatus 630 comprises a chamber lid 632. The chamber lid 632 includes an expanding channel 637 extending from a central portion of the chamber lid 632 and a bottom surface 660 extending from the expanding channel 637 to a peripheral portion of the chamber lid 632. The bottom surface 660 is sized and shaped to substantially cover the substrate 338 disposed on the substrate support 692. The chamber lid 632 may have a choke 662 at a peripheral portion of the chamber lid 632 adjacent the periphery of the substrate 338. The cap portion 672 includes a portion of the expanding channel 637 and gas inlets 636A, 636B. The expanding channel 637 has gas inlets 636A, 636B to provide gas flows from two similar valves 642A, 642B. The gas flows from the valves 642A, 642B may be provided together and/or separately.

In one configuration, valve 642A and valve 642B are coupled to separate reactant gas sources, but are coupled to the same purge gas source. For example, valve 642A is coupled to a reactant gas source 638 and valve 642B is coupled to reactant gas source 639, which both valves 642A, 642B are coupled to purge a gas source 640. Each valve 642A, 642B includes a delivery line 643A, 643B having a valve seat assembly 644A, 644B and includes a purge line 645A, 645B having a valve seat assembly 646A, 646B. The delivery line 643A, 643B is in communication with the reactant gas source 638, 639 and is in communication with the gas inlet 637A, 637B of the expanding channel 690. The valve seat assembly 644A, 644B of the delivery line 643A, 643B controls the flow of the reactant gas from the reactant gas source 638, 639 to the expanding channel 690. The purge line 645A, 645B is in communication with the purge gas source 640 and intersects the delivery line 643A, 643B downstream of the valve seat assembly 644A, 644B of the delivery line 643A, 643B. The valve seat assembly 646A, 646B of the purge line 645A, 645B controls the flow of the purge gas from the purge gas source 640 to the delivery line 643A, 643B. If a carrier gas is used to deliver reactant gases from the reactant gas source 638, 639, the same gas may be used as a carrier gas and a purge gas (i.e., an argon gas may be used as both a carrier gas and a purge gas).

Each valve 642A, 642B may be a zero dead volume valve to enable flushing of a reactant gas from the delivery line 643A, 643B when the valve seat assembly 644A, 644B of the valve is closed. For example, the purge line 645A, 645B may be positioned adjacent the valve seat assembly 644A, 644B of the delivery line 643A, 643B. When the valve seat assembly 644A, 644B is closed, the purge line 645A, 645B may provide a purge gas to flush the delivery line 643A, 643B. In the embodiment shown, the purge line 645A, 6458 is positioned as slightly spaced from the valve seat assembly 644A, 644B of the delivery line 643A, 643B so that a purge gas is not directly delivered into the valve seat assembly 644A, 644B when open. A zero dead volume valve as used herein is defined as a valve which has negligible dead volume (i.e., not necessarily zero dead volume). Each valve 642A, 642B may be adapted to provide a combined gas flow and/or separate gas flow of the reactant gas 638, 639 and the purge gas 640. The pulses of the purge gas may be provided by opening and closing a diaphragm of the valve seat assembly 646A of the purge line 645A. The pulses of the reactant gas from the reactant gas source 638 may be provided by opening and closing the diaphragm valve seat 644A of the delivery line 643A.

A control unit 680 may be coupled to the chamber 634 to control processing conditions. The control unit 680 comprises a central processing unit (CPU) 682, support circuitry 684, and memory 686 containing associated control software 683. The control unit 680 may be one of any form of general purpose computer processors that can be used in an industrial setting for controlling various chambers and sub-processors. The CPU 682 may use any suitable memory 686, such as random access memory, read only memory, floppy disk drive, compact disc drive, hard disk, or any other form of digital storage, local or remote. Various support circuits may be coupled to the CPU 682 for supporting the chamber 634. The control unit 680 may be coupled to another controller that is located adjacent individual chamber components, such as the programmable logic controllers 648A, 648B of the valves 642A, 642B. Bi-directional communications between the control unit 680 and various other components of the chamber 634 are handled through numerous signal cables collectively referred to as signal buses 688, some of which are illustrated in FIG. 6. In addition to the control of process gases and purge gases from gas sources 638, 639, 640 and from the programmable logic controllers 648A, 648B of the valves 642A, 642B, the control unit 680 may be configured to be responsible for automated control of other activities used in substrate processing, such as substrate transport, temperature control, chamber evacuation, among other activities, some of which are described elsewhere herein.

Figure 7:
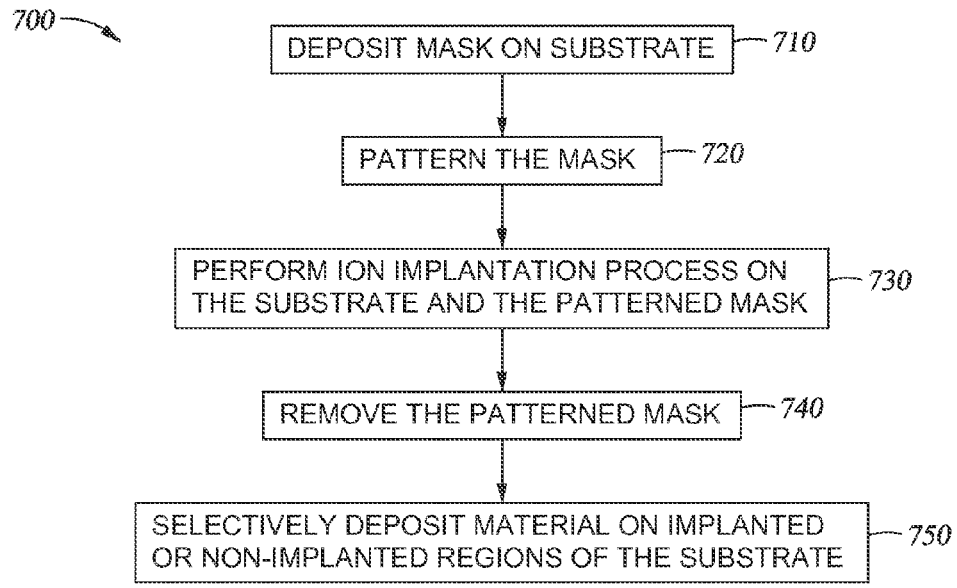
FIG. 7 schematically depicts a method for performing a selective deposition process.

FIG. 7 a method of performing a selective deposition process that may be performed to form different materials on different locations of a substrate. It is contemplated that the substrate may have various structures formed thereon extending outward from the substrate, such as a fin structure, a gate structure, a contact structure, or any other suitable structures utilized in semiconductor applications.

The method 700 begins at operation 710 by depositing a mask on a substrate, such as the substrate 338 depictured in FIGS. 3-6. In one embodiment, the substrate may be a material such as crystalline silicon (e.g., Si<100> or Si<111>), silicon oxide, strained silicon, silicon germanium, doped or undoped polysilicon, doped or undoped silicon substrates, patterned or non-patterned silicon on insulator (SOI) substrates, carbon doped silicon oxides, silicon nitride, doped silicon, germanium, gallium arsenide, glass, or sapphire. The substrate may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate, the substrate may include a buried dielectric layer disposed on a crystalline silicon substrate. The substrate may also be any polygonal, square, rectangular, curved or otherwise non-circular workpiece, such as a polygonal glass substrate used in the fabrication of flat panel displays.

The mask may be formed on the substrate by any suitable method. For example, the mask may be deposited on the substrate by a plasma enhanced chemical vapor deposition (CVD) process, a physical vapor deposition (PVD) process, a spin on process, or the like. The mask may be formed from materials which may be patterned, such as hardmask material or photoresist materials. Photoresist materials suitable for use as the mask include, polymeric materials, carbon based materials, and nanowire materials, among others. Suitable hardmask materials include, SiON, SiN, $SiO_2$, amorphous carbon, TiN, and TaN, among others. In one embodiment, the mask may be deposited in a desired pattern during the deposition process which may eliminate the need for subsequent patterning processes. Alternatively, a patterning process may be performed after the mask has been deposited on the substrate.

At operation 720, the mask may be patterned, if not already patterned during the deposition of the mask. The patterning process, such as a photolithography process, may be selected based upon the type of material utilized as the mask. Examples of patterning processes include exposing the mask to x-ray, electron beam, or ultraviolet radiation/light (including deep ultraviolet light and extreme ultraviolet light, among other sources of radiant energy. In one example, a photosensitive mask may be patterned used 248 nm lithography, 193 nm lithography, 157 nm lithography, EUV lithography, e-beam lithography, and the like.

The pattern developed on the mask may be any desirable pattern, such as lines, checkerboard, etc. suitable for subsequent integrated circuit design. Patterning of the mask may include removing portions of the mask to expose regions of the underlying substrate. After operation 720, the patterned mask may remain disposed on the substrate such that certain regions (e.g., first regions) of the substrate are exposed and other regions (e.g., second regions) of the substrate are covered by the mask.

At operation 730, an ion implantation process may be performed to dope, coat, treat, implant, insert or modify certain film/surface properties of both the mask and the exposed regions (e.g., first or implanted regions) of the substrate. As a result, the mask and exposed regions of the substrate may be modified and the regions (e.g., second or non-implanted regions) of the substrate covered by the mask may remain unmodified. For example, the mask may shield the second regions from implantation.

Operation 730 may utilize the aforementioned apparatus configured to implant ions on the substrate. Suitable ion implantation processes, such as the directional plasma process described above, may modify surface properties of the exposed regions of the substrate. Ions implanted into the exposed regions of the substrate, which include a desired type of atom, may be selected to in response to a certain type of material to be subsequently deposited, which will be described with greater detail in reference to operation 750. In one example, a desired atom species may be implanted into the patterned mask and the exposed regions of the substrate with a dosage of less than about $5E^{16}$ (ions/cm$^2$), for example a dosage of between about $1E^{14}$ (ions/cm$^2$) and about $5E^{16}$ (ions/cm$^2$).

Several process parameters may be controlled during the ion implantation process. In an exemplary ion implantation process, a plasma process may be performed by supplying a gas mixture into a processing chamber, such as chambers 300, 400, 500. The dopant gas mixture may be supplied into the processing chamber at a flow rate between about 10 sccm and about 200 sccm. Suitable gases for supplying in the ion doping gas mixture include $AsH_3$, $GaH_3$, $SH_4$, $SiF_4$, $GeH_4$, $GeF_4$, $CH_4$, $CF_4$, $AsF_5$, $PF_3$, $PF_5$, $B_2H_6$, $BH_3$ and the like. Inert gas, such as Ar, He, Kr, Ne or the like, or carrier gases, such as $H_2$, $N_2$, $N_2O$, $NO_2$, or the like, may also be supplied into the gas mixture. The chamber pressure is generally maintained between about 0.1 mTorr and about 100 mTorr, such as about 10 mTorr. An RF power, such as capacitive or inductive RF power, DC power, electromagnetic energy, or magnetron sputtering, may be supplied into the processing chamber to assist dissociating the gas mixture during processing.

Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma.

An electrical bias (peak to peak voltage) of between about 50 V and about 10,000 V, such as about 1000V is applied to the substrate support, the gas distributor, or both, to accelerate the ions toward the substrate surface with the desired energy. In some embodiments, the electrical bias is also used to ionize the processing gas. In other embodiments, a second electric field is used to ionize the process gas. In one embodiment, a RF field with a frequency of about 2 MHz is provided to ionize the processing gas and bias the substrate support at a power level between about 100 W and about 10,000 W, for example about 200 W. The ions produced will generally be accelerated toward the substrate by biasing the substrate or a gas distributor as described above.

In some embodiments, the power used to generate ions may be pulsed. Power may be applied to the plasma source for a desired time, and then discontinued for a desired time. Power cycling may be repeated for a desired number of cycles at a desired frequency and duty cycle. In some embodiments, the plasma may be pulsed at a frequency between about 1 Hz and about 50,000 Hz, such as between about 1000 Hz and about 5000 Hz. In other embodiments, the plasma pulsing may proceed with a duty cycle (ratio of powered time to unpowered time per cycle) between about 10% and about 90%, such as between about 25% and about 50%. In one embodiment, the RF source power may be supplied at between about 100 Watts to about 5000 Watts and the bias power may be supplied at between about 50 Watts and about 11000 Watts. The process temperature may be controlled at between about −100 degrees Celsius and about 650 degrees Celsius.

At operation 740, the patterned mask may be removed. Suitable mask removal processes, such as a wet clean or plasma ashing process, may be utilized to remove the mask. It is contemplated that the type of mask removal process utilized may be determined, at least in part, by the type of mask disposed on the substrate. In one example, if a photoresist was utilized as the mask, a piranha stripping process (sulfuric acid and hydrogen peroxide/buffered hydrofluoric acid) may be utilized to remove the mask. It is contemplated that the mask removal process may be performed in a manner such that exposed regions of the substrate and the regions of the substrate which were covered by the mask prior to removal of the mask are unmodified to maintain the doping profile of the implanted (exposed regions) and non-implanted (covered regions) regions of the substrate. As a result of the mask removal process, the substrate may exhibit implanted and non-implanted regions which have differing surface properties as a result of the on implantation operation 730.

At operation 750, a material may be selectively deposited on the implanted or non-implanted regions of the substrate. Various material deposition processes, such as an ALD process, may be utilized to deposit a material on desired regions of the substrate. The material selected to be deposited may be influenced by the surface properties of the substrate, i.e. implanted vs. non-implanted regions. The implanted regions of the substrate may absorb and react with the molecules supplied during the ALD process so as to incorporate atoms from each pulse of the ALD process to enable the growth and continuous deposition of the material being deposited. Alternatively, non-implanted regions of the substrate may absorb and react with the molecules supplied during the ALD process so as to incorporate atoms from each pulse of the ALD process to enable deposition of the desired material. Thus, the desired region of the substrate may include either the implanted or non-implanted regions.

As the ALD process is sensitive to surface conditions, the method 700 is suitable for a selective deposition of materials on specific regions of the substrate. The ALD process is a CVD process with self-terminating/limiting growth. The ALD process yields a thickness of only a few angstroms or in a monolayer level. The ALD process is controlled by distribution of a chemical reaction into two separate half reactions which are repeated in cycles. The thickness of the material formed by the ALD process depends on the number of the reaction cycles. The first reaction provides a first atomic layer of molecular layer being absorbed on the substrate and the second reaction provides a second atomic layer of molecular layer being absorbed on the first atomic layer. As such, the ordered structure of the material acts as a template for the growth of the material layer.

The implanted or non-implanted regions, depending upon the type ion implanted and the type of material being deposited, may prohibit deposition of the ALD materials on either the implanted or non-implanted regions. Alternatively, again depending upon the type of ion implanted and the type of material being deposited, the implanted and non-implanted regions of the substrate may serve as an initiation seed/nucleation surface that allows ALD materials to nucleate and grow on the nucleated sites. In this manner, a selective deposition process may selectively deposit different materials at different locations on the substrate.

During the ALD process, a first reactant gas mixture may be supplied simultaneously with, sequentially with, or alternatively without a reducing gas mixture ("reagent"), such as a hydrogen gas ($H_2$) or a $NH_3$ gas, into the processing chamber 634 during a thermal ALD process or a plasma ALD process as needed. A suitable first reactant gas mixture that may be supplied into the processing chamber 634 may include a silicon containing gas, such as $SiH_4$, $Si_2H_6$, or other suitable silicon containing compounds, and/or one or more of a tantalum containing gas, titanium containing gas, platinum containing gas, cobalt containing gas, tungsten containing gas, aluminum containing gas, nickel containing gas, copper containing gas, silver containing gas, gold containing gas, hafnium containing gas, ruthenium containing gas, boron containing gas, phosphorus containing gas, nitrogen containing gas, oxygen containing gas, combinations and mixtures thereof, or other suitable gases that may deposit a monolayer on the substrate surface suitable for using in semiconductor devices. Examples of the alternative reagents (i.e., reducing agents used with reactant gases for forming the monolayer during the deposition process) as described herein may include hydrogen (e.g., $H_2$ or atom-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

The first reactant gas mixture pulse lasts for a predetermined time interval. The term pulse as used herein refers to a dose of material injected into the process chamber. Between each pulse of the first reactant gas mixture or of the first and a second reactant gas mixture, which will be discussed further below, the purge gas mixture may be pulsed into the processing chamber in between each or multiple pulses of the first and/or second reactant gas mixture to remove the impurities or residual gas mixture which is unreacted/non-absorbed by the substrate surface (e.g., unreacted impurities from the reactant gas mixture or others) so they can be pumped out of the processing chamber.

During pulsing of the first reactant gas mixture, several process parameters are also controlled. In one embodiment, the process pressure is controlled at between about 7 Torr and about 30 Torr. The processing temperature is between about 100° Celsius and about 450° Celsius. The RF power may be controlled at between about 100 watts and about 2000 watts. The reactant gas supplied in the first reactant gas mixture may be controlled at between about 5 sccm and about 10 sccm. The reducing gas may be supplied at between about 100 sccm and about 700 sccm.

After termination of the pulse of the first reactant gas, a pulse of a second reactant gas mixture is supplied into the processing chamber 634 to form a second monolayer of the desired material on the desired region of the substrate. The second reactant gas mixture may be supplied simultaneously with, sequentially with, or alternatively without a reducing gas mixture (or reagent), such as a hydrogen gas ($H_2$) or a $NH_3$ gas, into the processing chamber 634 during a thermal ALD process or a plasma ALD process as needed. It is believed that the second monolayer is absorbed onto the first monolayer by a chemical reaction to allow the atoms from the second monolayer to be securely adhered on the atoms from the first monolayer.

In one embodiment, a suitable second reactant gas mixture that may be supplied into the processing chamber 634 may include a silicon containing gas, such as $SiH_4$, $Si_2H_6$, or other suitable silicon containing compounds, and one or more of oxygen containing gas, such as $H_2O$, $O_2$, or $O_3$, tantalum containing gas, titanium containing gas, platinum containing gas, cobalt containing gas, tungsten containing gas, aluminum containing gas, nickel containing gas, copper containing gas, silver containing gas, gold containing gas, hafnium containing gas, ruthenium containing gas, boron containing gas, phosphorus containing gas, nitrogen containing gas, oxygen containing gas, combinations and mixtures thereof, or other suitable gases that may deposit a monolayer on the substrate surface suitable for using in semiconductor devices. Examples of the alternative reagents (i.e., reducing agents used with reactant gas for forming the monolayer during the deposition process) as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

The pulse of the second reactant gas mixture lasts for a predetermined time interval. Between each pulse or a number of pulses of the second reactant gas mixture or of the first and the second reactant gas mixture, the purge gas mixture may be pulsed into the processing chamber to remove the impurities or residual gas mixture which is unreacted/non-absorbed by the substrate surface (e.g., unreacted impurities from the reactant gas mixture or others).

During pulsing of the second reactant gas mixture, several process parameters are also controlled. In one embodiment, the process pressure is controlled at between about 5 Torr and about 30 Torr. The processing temperature is between about 125° Celsius and about 450° Celsius. The RF power may be controlled at between about 100 watts and about 800 watts. The reactant gas supplied in the second reactant gas mixture may be controlled at between about 5 sccm and about 20 sccm. The reducing gas may be supplied at between about 100 sccm and about 700 sccm.

In between each or after several pulses of reactant gas mixtures, a purge gas mixture is then supplied into the processing chamber 634 to purge out the residuals and impurities from the processing chamber. Several process parameters are also controlled during pulsing of the purge gas mixture. In one embodiment, the process pressure is controlled at between about 1 Torr and about 100 Torr. The processing temperature is between about 125° Celsius and about 450° Celsius. The RF power may be controlled at between about 100 watts and about 800 watts. The Ar or $N_2$ gas may be supplied at between about 200 sccm and about 1000 sccm.

Subsequent to the pulse of the purge gas mixture, additional cycles starting from the pulsing of the first and/or second reactant gas mixtures followed by the pulse of the purge gas mixture can then be repeatedly performed until a desired thickness of the material is obtained. When a subsequent cycle of pulsing the first reactant gas mixture starts, the process pressure and other process parameters may be regulated to the predetermined level to assist depositing a subsequent monolayer of the material.

Figure 8:
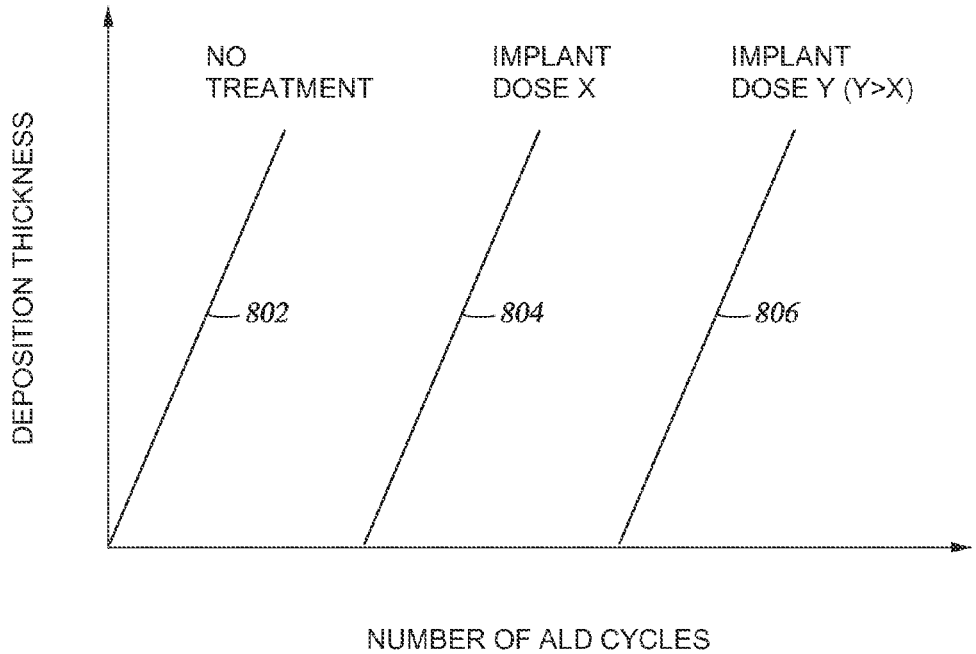
FIG. 8 is a graph schematically illustrating nucleation delay of an ALD process in relation to a dosage of ions implanted in a substrate.

FIG. 8 is a graph 800 schematically illustrating nucleation delay of an ALD process in relation to a dosage of ions implanted in a substrate. The X axis of the graph represents the number of ALD cycles performed and the Y axis represents the deposition thickness of the layer being deposited. Line 802 illustrates the nucleation and growth of a material layer when deposited on a substrate surface which has not been treated or modified, for example, by ion implantation. As can be seen, nucleation beings at or near the first ALD cycle.

Line 804 illustrates the nucleation and growth of a material layer when deposited on a substrate surface which has been modified with an implant dose x. Here, the nucleation of the material is delayed as a result of the modification of the substrate surface due to the dosage of ions incorporated into the substrate surface. Line 806 illustrates the nucleation and growth of a material layer when deposited on a substrate surface which has been modified with an implant dose y, where y>x. Here, the nucleation of the material is further delayed as a result of the modification of the substrate due to the increased dosage of ions incorporated into the substrate surface.

Thus, it can he seen that the amount of nucleation delay may depend on the implant dose. Utilizing the benefits of nucleation delay with the method 700, film thicknesses after a certain number of ALD cycles are different for implanted and non-implanted regions of the substrate. Accordingly, materials may be deposited selectively predominantly on desired regions of the substrate, such as the non-implanted regions created after removal of the mask. It should be noted that proper ion dosage and ALD deposition parameters should be utilized to realize the benefits of nucleation delay observed between implanted and non-implanted regions of the substrate.

In summation, ion implantation of a substrate having a patterned mask disposed thereon, and the subsequent removal of the mask, may be utilized to generate implanted and non-implanted regions on a substrate. Nucleation delay phenomena may be utilized, in combination with the selection of ion dosage parameters and material deposition parameters, to selectively deposit materials on desired regions of the substrate while other regions of the substrate exhibit little or no material deposition. Accordingly, selective deposition of materials on a substrate may be improved by utilizing the methods described herein.

While the foregoing is directed to embodiments of the present disclosure, other and further embodiments of the disclosure may be devised without departing from the basic scope thereof, and the scope thereof is determined by the claims that follow.

What is claimed is:

1. A selective deposition method, comprising:
depositing a mask material on a substrate;
patterning the mask material to form a patterned mask, wherein regions of the substrate are exposed after the patterning;
implanting ions into the patterned mask and the exposed regions of the substrate, wherein the exposed regions are implanted regions;
removing the patterned mask; and
providing a reactant gas mixture to the implanted and non-implanted regions of the substrate, the reactant gas mixture promoting deposition of a material selected from the group consisting of W, Pt, Cu, Ru, $RuO_2$, Co, Al, $Al_2O_3$, $HfO_2$, Au, Ag, and combinations thereof on the non-implanted regions of the substrate in response to surface modification of the exposed regions while the implanted regions remain substantially free of deposited material.

2. The method of claim 1, wherein the patterned mask is removed prior to the providing a reactant gas mixture to the implanted and non-implanted regions of the substrate.

3. The method of claim 1, wherein the mask material is a hardmask material.

4. The method of claim 1, wherein the mask material is a photoresist material.

5. The method of claim 4, wherein the photoresist material is patterned using a 193 nm photolithography process.

6. The method of claim 1, wherein implanting ions comprises:
  implanting a dosage of ions configured to cause a desired nucleation delay when providing the reactant gas mixture to the implanted and non-implanted regions promoting deposition of the material on the non-implanted regions of the substrate.

7. A selective deposition method, comprising:
  depositing a mask material on a substrate;
  patterning the mask material to form a patterned mask, wherein regions of the substrate are exposed through the patterned mask after the patterning;
  implanting ions into the patterned mask and the exposed regions of the substrate;
  removing the patterned mask from the substrate to expose non-implanted regions of the substrate; and
  performing an atomic layer deposition (ALD) process by providing a reactant gas mixture to the implanted and non-implanted regions of the substrate, the reactant gas mixture promoting deposition of a material on the non-implanted regions of the substrate while implanted regions remain substantially free of deposited material.

8. The method of claim 7, wherein the mask material is a photoresist material.

9. The method of claim 8, wherein implanting ions further comprises:
  implanting fluorine ions at a dosage of less than about $5 \times 10^{16}$ (ions/cm$^2$).

10. The method of claim 7, wherein removing the patterned mask comprises:
  performing a wet etching process or a plasma ashing process, the processes configured to prevent modification of the implanted regions of the substrate.

11. The method of claim 7, wherein the providing the reactant gas mixture promoting deposition of the material comprises:
  depositing a material selected from the group consisting of W, Pt, Cu, Ru, RuO$_2$, Co, Al, Al$_2$O$_3$, HfO$_2$, Au, Ag, and combinations thereof.

12. The method of claim 11, wherein implanting ions further comprises:
  implanting an ion species at a dosage selected to generate a nucleation delay on an implanted region when the ALD process is performed.

13. The method of claim 12, wherein the performing an ALD process comprises:
  maintaining the substrate at a temperature less than about 500° Celsius.

14. A selective deposition method, comprising:
  implanting fluorine ions into a patterned mask and a first region of a substrate exposed through the patterned mask, the fluorine ions implanted at ion dosage less than about $5 \times 10^{16}$ (ions/cm$^2$);
  removing the patterned mask from the substrate to expose a second region of the substrate, the second region shielded from fluorine ions during implanting of the fluorine ions in the first region; and
  providing a reactant gas mixture promoting deposition of a material using an ALD process while maintaining the substrate at a temperature of less than about 500° Celsius, the ALD process promoting deposition of the material on the second region and not the first region, wherein the first region remains substantially free of the deposited material.

* * * * *